(12) United States Patent
Sakai

(10) Patent No.: US 6,489,792 B1
(45) Date of Patent: Dec. 3, 2002

(54) CHARGE-UP MEASURING APPARATUS

(75) Inventor: Shigeki Sakai, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/558,231

(22) Filed: Apr. 26, 2000

(30) Foreign Application Priority Data

Apr. 26, 1999 (JP) .......................................... 11-118221

(51) Int. Cl.⁷ ...................... G01R 31/02; G01R 31/302; G01N 23/00
(52) U.S. Cl. ...................... 324/757; 324/750; 324/752; 250/310
(58) Field of Search ................................ 324/757, 765, 324/766, 752, 750, 751, 71.3; 250/492.2, 309, 310, 311, 398, 397; 438/526, 527

(56) References Cited

U.S. PATENT DOCUMENTS

| | | | | |
|---|---|---|---|---|
| 3,895,978 A | * | 7/1975 | Tarui et al. ................... | 438/527 |
| 3,969,670 A | * | 7/1976 | Wu .............................. | 324/751 |
| 4,052,229 A | * | 10/1977 | Pashley ....................... | 438/276 |
| 4,473,795 A | * | 9/1984 | Wood .......................... | 324/501 |
| 4,536,223 A | * | 8/1985 | Faith, Jr. ..................... | 438/526 |
| 4,675,530 A | * | 6/1987 | Rose et al. .................. | 250/492.2 |
| 5,179,279 A | * | 1/1993 | Millard et al. ............... | 250/309 |
| 5,233,291 A | * | 8/1993 | Kouno et al. ................ | 324/765 |
| 5,412,209 A | * | 5/1995 | Otaka et al. ................. | 250/310 |
| 5,475,319 A | * | 12/1995 | Hirae et al. .................. | 324/765 |
| 5,493,236 A | * | 2/1996 | Ishii et al. ................... | 324/765 |
| 5,519,334 A | * | 5/1996 | Dawson ....................... | 324/752 |
| 5,659,244 A | * | 8/1997 | Sakaguchi ................... | 324/752 |
| 5,844,416 A | * | 12/1998 | Campbell et al. ............ | 324/750 |
| 5,912,468 A | * | 6/1999 | Hirano et al. ................ | 250/310 |
| 5,952,837 A | * | 9/1999 | Koyama ....................... | 324/752 |
| 5,999,465 A | * | 12/1999 | Shabde et al. ............... | 324/752 |
| 6,232,787 B1 | * | 5/2001 | Lo et al. ...................... | 324/751 |

FOREIGN PATENT DOCUMENTS

| | | | |
|---|---|---|---|
| JP | 62-15745 | 1/1987 | |
| JP | 1-248452 | 10/1989 | |
| JP | 04-022900 | 1/1992 | |
| JP | 0509374 A | * 4/1993 | .......... H01L/21/66 |
| JP | 10040856 | 2/1998 | |
| JP | 11096960 | 9/1999 | |

OTHER PUBLICATIONS

British Search Report dated Aug. 21, 2000.
K. Naito, "Ion–Implanting Device", Abstract of JP 040856, (1998).

* cited by examiner

Primary Examiner—Michael Sherry
Assistant Examiner—Jermele Hollington
(74) Attorney, Agent, or Firm—Finnegan, Henderson, Farabow, Garrett & Dunner LLP

(57) ABSTRACT

A charge-up measuring apparatus has a plurality of measurement conductors being arranged on a plane crossing an ion beam for receiving the ion beam, a plurality of bidirectional constant-voltage elements connected to the measurement conductors in a one-to-one correspondence, and a plurality of current measuring instruments each for measuring the polarity and the magnitude of an electric current flowing through the corresponding bidirectional constant-voltage element.

8 Claims, 6 Drawing Sheets

CHARGE-UP MEASURING APPARATUS

BACKGROUND OF THE INVENTION

1. Field of the Invention

The present invention relates to a charge-up measuring apparatus used with an ion beam irradiation apparatus for irradiating a substrate with an ion beam for conducting treatment of ion implantation, etc., an ion implantation apparatus for irradiating a semiconductor substrate with an ion beam for forming MOS field effect transistors (MOSFET) on the surface of the semiconductor substrate, or the like for measuring charge-up of the substrate (charge phenomenon) with ion beam irradiation and more particularly to a charge-up measuring apparatus for measuring charge-up of the substrate simulatedly.

2. Description of the Related Art

Hitherto, by executing ion implantation into a semiconductor substrate, a semiconductor device, for example, a MOS field effect transistor 10 as shown in FIG. 8 has been formed on the surface of the semiconductor substrate.

To put it simply, the MOS field effect transistor 10 is manufactured by executing steps of forming a gate oxide film 4 and an element separation oxide film 5 on the surface of a semiconductor substrate (for example, silicon substrate) 2 according to a predetermined pattern, forming a gate electrode 6 on the surface of the gate oxide film 4, and using the gate electrode 6 as a mask to execute ion implantation of dopant (doped impurity) ions into both sides of the gate electrode 6, thereby forming a predetermined pattern of two impurity-doped layers 8. One impurity-doped layer 8 becomes a source and the other impurity-doped layer 8 becomes a drain.

The portion of the MOS field effect transistor 10, where the gate oxide film 4 is sandwiched between the gate electrode 6 and the semiconductor substrate 2, forms a capacitor structure and at the dopant ion implantation time, the positive charges transported accordingly are accumulated in the gate electrode 6.

There is a tendency to make fine such a MOS field effect transistor 10; as the MOS field effect transistor 10 is made fine, the gate oxide film 4 becomes thin. For example, the gate oxide film 4 is made of silicon oxide and plays an important role in determining the MOS field effect transistor 10. As the gate oxide film 4 becomes thin, the withstand voltage of the gate oxide film 4 lessens. For example, the gate oxide film 4 is about 50 nm thick, in which case when charges are accumulated in the gate electrode 6 with ion implantation and the voltage becomes in the vicinity of 5 V, an electric current starts to flow penetrating the gate oxide film 4. The amount of charges penetrating the gate oxide film 4 are lessened as much as possible, leading to enhancement of the reliability of the gate oxide film 4 and prolong the life of the MOS field effect transistor 10.

To suppress positive charge-up (charge accumulation) caused by ions as described above, an ion implantation apparatus usually is provided with an electron supply source for supplying low energy electrons for neutralization to an ion beam in the upstream vicinity of the doped substrate. One of the electron supply sources is a plasma supply source for supplying plasma containing low energy electrons to an ion beam.

If such an electron supply source or a plasma supply source is provided, when insufficient electrodes are supplied, positive charge-up occurs on the substrate surface and when excessive electrons are supplied, negative charge-up occurs on the substrate surface. Thus, preferably the electron supply amount is controlled. To do this, at the first stage, it is necessary to measure the charge-up state on the substrate.

One of such charge-up measuring techniques is a technique wherein a charge-up measurement device is formed on the surface of a substrate and after ion implantation, the characteristics of the device are checked for measuring the charge-up state at a later time. However, in this technique, the doped substrate needs to be taken out from the vacuum vessel for measurement. Thus, checking the charge-up state requires at least several hours; this is a large problem.

To solve such a problem, JP-A-10-40856 proposes a charge-up measuring apparatus wherein a plurality of measurement conductors (beam collectors) placed in a state similar to the state of a substrate are connected to high resistance and the voltage of each measurement conductor at the ion beam irradiation time is measured, whereby the charge-up state of the substrate is measured simulatedly.

Generally, low energy electrons are used for ion beam neutralization. Specifically, the electrons emitted for neutralization from the electron supply source or the plasma supply source have an energy distribution, but most of the electrons are designed so as to become low energy electrons of about several eV, for example. The reason why they are designed so is that if successive electrons are supplied, the substrate surface is charged up negatively to the voltage corresponding to the electron energy and thus the charge-up voltage needs to be reduced. Therefore, it can be said that the orbit of the low energy electrons of about several eV in the vicinity of the substrate determines lessening charge-up of the substrate.

However, with the charge-up measuring apparatus described in JP-A-10-40856, there is a possibility that the voltage of the measurement conductor may become high as compared with the charge-up voltage of the substrate surface to be measured, because the charge-up voltage of MOS field effect transistor 10 of 5-V withstand voltage, for example, formed on the substrate surface does not become more than 5 V. If the voltage attempts to exceed 5 V, an electric current flows through the gate oxide film 4 and the voltage is lowered. However, since the measurement conductor is insulated and supported by an electrical porcelain, the voltage of the measurement conductor can become a high voltage of 5 V or more. The presence of such a high-voltage measurement conductor would have an effect on the orbit of the low energy electrons of about several eV described above.

Therefore, a difference occurs between the orbit of the electrons in the vicinity of the measurement conductor and the orbit of the electrons in the vicinity of the substrate surface to be measured, thus the voltage of the measurement conductor does not accurately reflect the charge-up state on the substrate surface. Therefore, the charge-up measurement precision of the substrate is degraded.

SUMMARY OF THE INVENTION

It is therefore an object of the present invention to provide a charge-up measuring apparatus capable of measuring charge-up of a substrate simulatedly and moreover with high accuracy.

According to a first aspect of the invention, there is provided a charge-up measuring apparatus comprising a plurality of measurement conductors being arranged on a plane crossing an ion beam for receiving the ion beam, a plurality of bidirectional constant-voltage elements being connected to the measurement conductors in a one-to-one correspondence, and a plurality of current measuring instruments each for measuring the polarity and magnitude of an electric current flowing through the corresponding bidirectional constant-voltage element.

According to a first aspect of the present invention, if the ion beam is not completely neutralized, each measurement conductor undergoes ion beam irradiation and is charged up positively or negatively and the voltage is raised positively or negatively. However, since the bidirectional constant-voltage elements are used, when the voltage of the measurement conductor is smaller than the breakdown voltage of the corresponding bidirectional constant-voltage element, the bidirectional constant-voltage element blocks the voltage of the measurement conductor and no current flows into the corresponding current measuring instrument. If any of the measurement conductors has charge-up voltage raised to the breakdown voltage, the bidirectional constant-voltage element connected to the measurement conductor is brought into conduction and the electric current of the polarity and the magnitude responsive to the charge-up of the measurement conductor flows through the bidirectional constant-voltage elements into the current measuring instrument corrected thereto. The current measuring instrument measures the polarity and the magnitude of the electric current. Therefore, each measurement conductor is placed in a state similar to that of the substrate, whereby charge-up of the substrate can be measured simulatedly.

Moreover, the charge-up voltage of each measurement conductor does not rise above the breakdown voltage of the corresponding bidirectional constant-voltage element as the bidirectional constant-voltage element conducts. That is, the charge-up voltage of each measurement conductor is limited to the breakdown voltage or less. Consequently, at the measuring time, the effect of the voltage of each measurement conductor on the orbit of low energy electrons can be lessened. Therefore, charge-up of the substrate can be measured simulatedly and moreover with high accuracy.

According to a second aspect of the present invention, a plurality of charge amount measuring instruments each for measuring the amounts of positive and negative charges flowing through the corresponding bidirectional constant-voltage element may be provided in place of the current measuring instruments. Thus, charge-up of the substrate can be measured simulatedly and moreover with high accuracy based on the passing-through charge amount.

According to a third aspect of the present invention, in order to use the charge-up measuring apparatus according to the invention with an ion implantation apparatus for forming a MOS field effect transistor on the surface of a semiconductor substrate by ion implantation, preferably the breakdown voltage of each bidirectional constant-voltage element is made almost equal to the withstand voltage of the gate oxide film of the MOS field effect transistor. Thus, the maximum charge-up voltage of each measurement conductor can be made almost equal to the maximum charge-up voltage of the MOS field effect transistor on the substrate surface, so that charge-up can be measured simulatedly and moreover with higher accuracy.

According to a fourth aspect of the present invention, a plurality of charge amount measuring instruments each for measuring the amounts of positive and negative charges flowing through the corresponding bidirectional constant-voltage element may be provided in place of the current measuring instruments. Thus, the amount of charges penetrating the gate oxide film of the MOS field effect transistor because of charge-up can be measured simulatedly with higher accuracy. Consequently, not only measurement of the charge-up state of the MOS field effect transistor 10, but also simulated measurement of a break mode based on the amount of charges passing through the gate oxide film can be made.

PREFERRED EMBODIMENTS OF THE INVENTION

Preferred embodiments of the present invention will be described as follows referring to the accompanying drawings.

Figure 1:
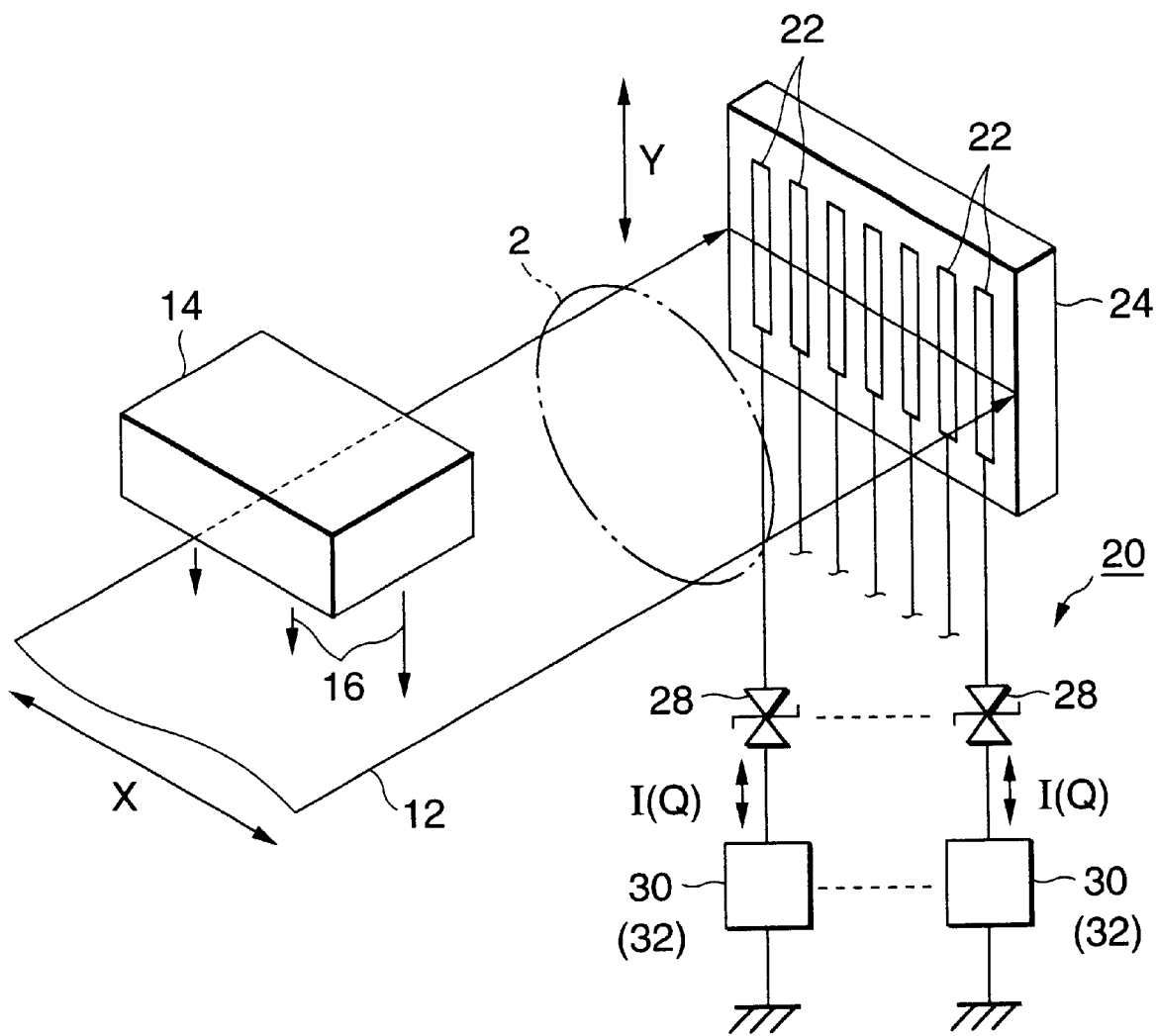
FIG. 1 is a drawing to show an example of a charge-up measuring apparatus according to the invention used with an ion beam irradiation apparatus.
Figure 2:
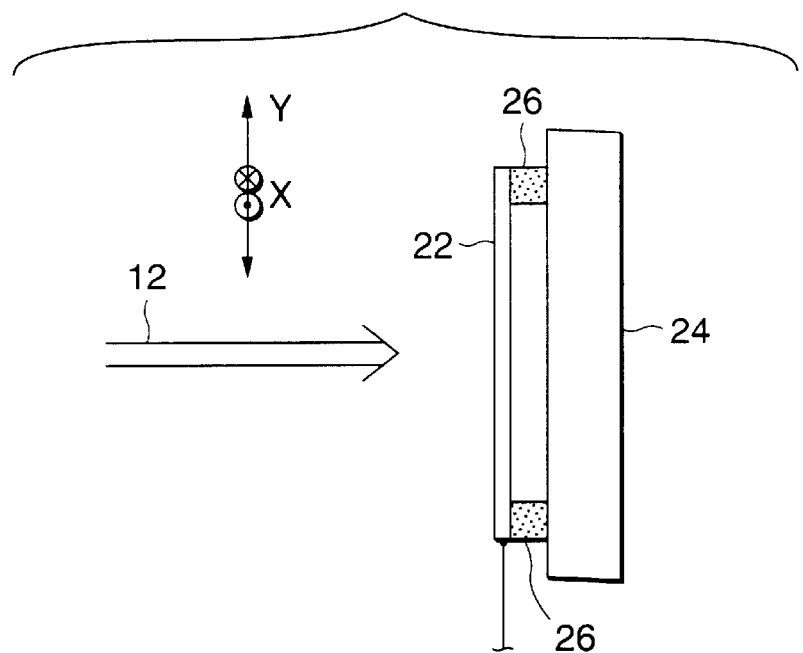
FIG. 2 is an enlarged side view of the surroundings of a measurement conductor in FIG. 1.

FIG. 1 is a drawing to show an example of a charge-up measuring apparatus according to the invention used with an ion beam irradiation apparatus. FIG. 2 is an enlarged side view of the surroundings of a measurement conductor in FIG. 1.

The ion beam irradiation apparatus irradiates a substrate 2 with an ion beam 12 in a vacuum atmosphere for executing treatments of ion implantation, ion beam etching, etc., for the substrate 2. To execute ion implantation into the substrate 2, the apparatus can be called an ion implantation apparatus. The substrate 2 is, for example, a semiconductor substrate of a silicon substrate, etc., as described above.

In the example, the ion beam 12 is scanned in an X direction (for example, horizontal direction) by scanning device (not shown). To irradiate the full face of the substrate 2 with the ion beam 12, the substrate 2 is mechanically scanned in a Y direction substantially orthogonal to the X direction (for example, the Y direction) by scanning device (not shown). To make the ion beam 12 incident on measurement conductors 22 described later, the substrate 2 is retreated from the orbit of the ion beam 12.

As one example of an electron supply source, a plasma supply source 14 for supplying plasma 16 containing low energy electrons for charge neutralization to the ion beam 12 is placed in the upstream vicinity of the substrate 2. The plasma supply source 14 is also called a plasma flood gun.

A charge-up measuring apparatus 20 in this embodiment has a plurality of measurement conductors 22 being arranged on a plane crossing the ion beam 12 for receiving the ion beam 12, a plurality of bidirectional constant-voltage elements 28 connected to the measurement conductors 22 in a one-to-one correspondence, and a plurality of current measuring instruments 30 each for measuring the polarity (in other words, direction) and the magnitude of an electric current I flowing through the corresponding bidirectional constant-voltage element 28.

The measurement conductors 22 are arranged side by side in the scanning direction of the ion beam 12, namely, the above-mentioned X direction. In the example, each measurement conductor 22 is rectangular and is electrically insulated and supported by electrical porcelains 26 on the front of a support 24 as shown in FIG. 2. The number of the measurement conductors 22 is, for example, eight to 12, but is not limited to a specific number; the greater the number of the measurement conductors 22, the finer the measurement.

Preferably, the measurement conductors 22 are placed near the substrate 2 on which measurements are to be made. In doing so, the measurement conductors 22 can be placed in a state similar to that of the substrate 2, namely, the states of the electrons in the plasma 16 and the ion beam 12 arriving at the substrate 2 can be brought close to those of the electrons in the plasma 16 and the ion beam 12 arriving at the measurement conductors 22, so that charge-up measurement of the substrate 2 can be made more accurately. As the support 24, a multipoint beam monitor for measuring the degree of parallelization of ion beam, etc., for example, as described in JP-A-4-22900 may be used.

Each bidirectional constant-voltage element 28 is an element showing a constant-voltage characteristic for both positive voltage and negative voltage. That is, it is an element having the following characteristic: An electric current little flows until a constant-voltage , called breakdown voltage, for both positive voltage and negative voltage and when the breakdown voltage is exceeded, an electric current starts to flow rapidly and the voltage across the element does not rise above the breakdown voltage. The reason why the bidirectional constant-voltage elements 28 are used is that the substrate 2 or each measurement conductor 22 is charged up positively or negatively depending on the supply amount of electrons from the plasma supply source 14 and thus both positive charge-up and negative charge-up can be measured using the bidirectional constant-voltage elements 28.

Preferably, a bidirectional Zener diode showing a Zener characteristic for both positive voltage and negative voltage is uses as each bidirectional constant-voltage element 28, because the bidirectional Zener diode has a very sharp current rising characteristic in both positive and negative areas. For the bidirectional Zener diode, the breakdown voltage is called Zener voltage. A bidirectional varistor may be used as each bidirectional constant-voltage element 28, but has a comparatively large capacitance component and it is feared that a displacement current may flow due to rapid voltage change, thus it is also preferred to use bidirectional Zener diodes for this reason.

Each bidirectional constant-voltage element 28 may be made up of two constant-voltage elements (for example, Zener diodes) connected in series in opposite directions; such a configuration also provides a substantial bidirectional constant-voltage element.

Each current measuring instrument 30 is, for example, an ampere meter. The electric current I flowing through each bidirectional constant-voltage element 28 may be switched and measured with one current measuring instrument rather than a plurality of current measuring instruments 30.

According to the charge-up measuring apparatus 20, if the ion beam 12 is not completely neutralized, each measurement conductor 22 undergoes ion beam irradiation and is charged up positively or negatively and the voltage is raised positively or negatively. However, since the bidirectional constant-voltage elements 28 are used, when the voltage of the measurement conductor 22 is smaller than the breakdown voltage of the corresponding bidirectional constant-voltage element 28, the bidirectional constant-voltage element 28 blocks the voltage of the measurement conductor 22 and no current flows into the corresponding current measuring instrument 30. If any of the measurement conductors 22 has charge-up voltage raised to the breakdown voltage, the bidirectional constant-voltage element 28 connected to the measurement conductor 22 is brought into conduction and the electric current I of the polarity and the magnitude responsive to the charge-up of the measurement conductor 22 flows through the bidirectional constant-voltage elements 28 into the current measuring instrument 30 corrected thereto. The current measuring instrument 30 measures the polarity and the magnitude of the electric current I. Therefore, each measurement conductor 22 is placed in a state similar to that of the substrate 2, whereby charge-up of the substrate 2 can be measured simulatedly.

Moreover, the charge-up voltage of each measurement conductor 22 does not rise above the breakdown voltage of the corresponding bidirectional constant-voltage element 28 as the bidirectional constant-voltage element 28 conducts. That is, the charge-up voltage of each measurement conductor 22 is limited to the breakdown voltage or less. Consequently, at the measuring time, the effect of the voltage of each measurement conductor 22 on the orbit of low energy electros can be lessened. Therefore, charge-up of the substrate 2 can be measured simulatedly and moreover with high accuracy.

Figure 5:
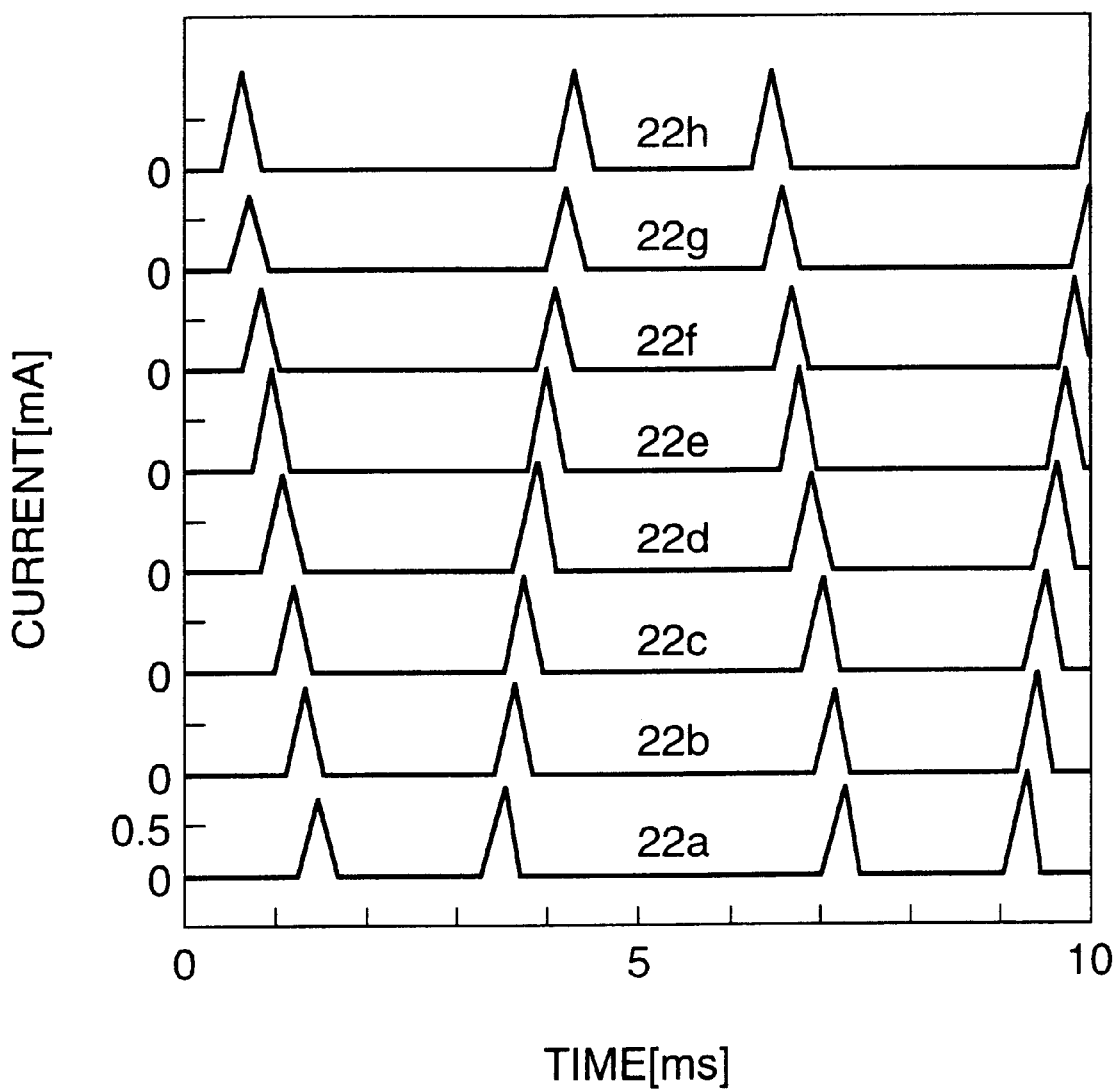
FIG. 5 is a drawing to show one example of the measurement result of the charge-up measuring apparatus shown in FIG. 1.
Figure 6:
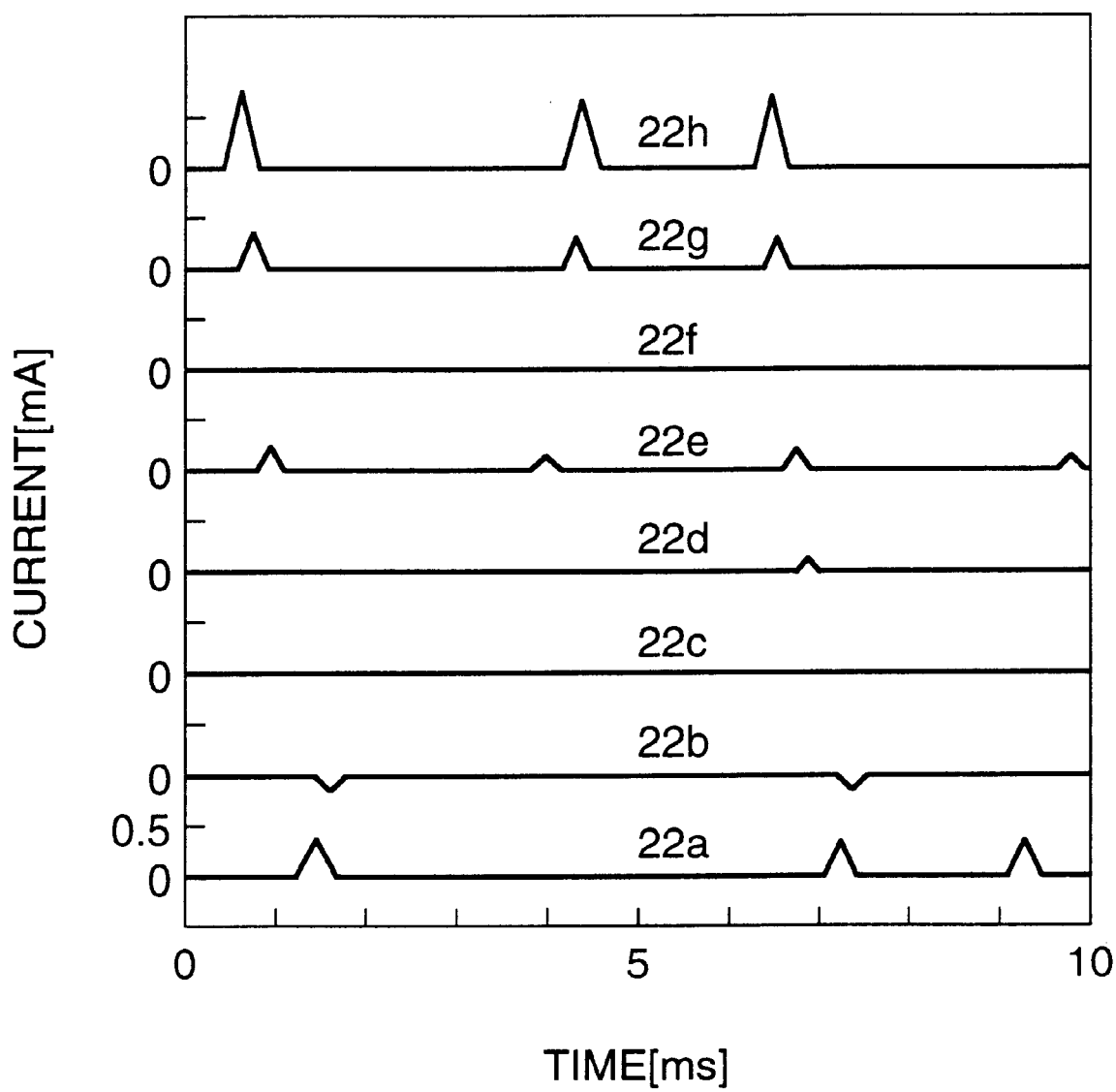
FIG. 6 is a drawing to show another example of the measurement result of the charge-up measuring apparatus shown in FIG. 1.
Figure 7:
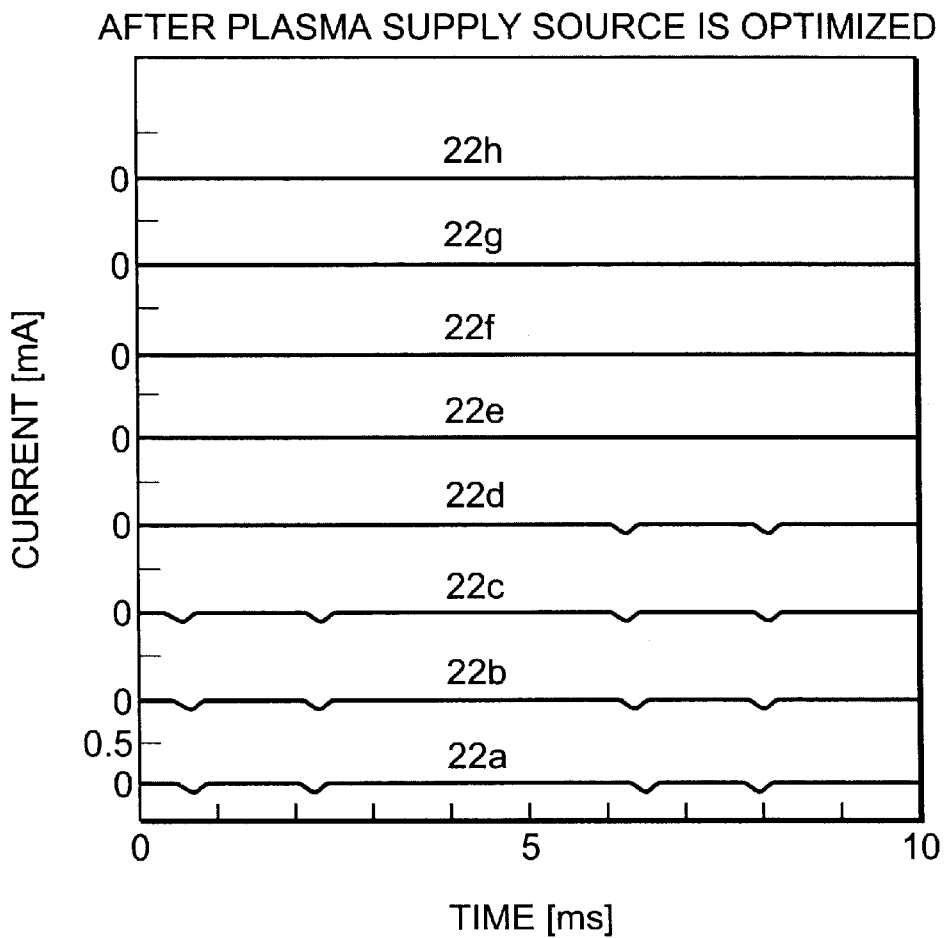
FIG. 7 is a drawing to show still another example of the measurement result of the charge-up measuring apparatus shown in FIG. 1.

FIGS. 5 to 7 show examples of the measurement results of the charge-up measuring apparatus 20. The measurement results of electric currents I flowing into eight measurement conductors 22a to 22h placed side by side are shown. The measurement conductors 22d and 22e are positioned at the center. The polarity and the magnitude of each electric current I represent those of charge-up of the corresponding measurement conductor 22a to 22h. The peak position changes with time as a result of X-direction scanning of the ion beam 12.

FIG. 5 shows an example where the plasma supply source 14 is not used; it is seen that positive charge-up caused by positive charges of the ion beam 12 occurs in all measurement conductors 22a to 22h .

FIG. 6 shows an example where the amount of electrons emitted from the plasma supply source 14 is not optimized although the plasma supply source 14 is used; it is seen that comparatively large positive charge-up occurs in the measurement conductors 22a, 22h, etc., to the ends. It is considered that the electrons emitted from the plasma supply source 14 do not sufficiently reach the end parts of the ion beam 12.

FIG. 7 shows an example where the amount of electrons emitted from the plasma supply source 14 is optimized; it is seen that slight negative charge-up occurs only in the measurement conductors 22a to 22c to the end and that charge-up is well suppressed as a whole.

A plurality of charge amount measuring instruments 32 each for measuring the amounts of positive and negative charges flowing through each bidirectional constant-voltage element 28, Q, may be provided in place of the current measuring instruments 30.

Figure 3:
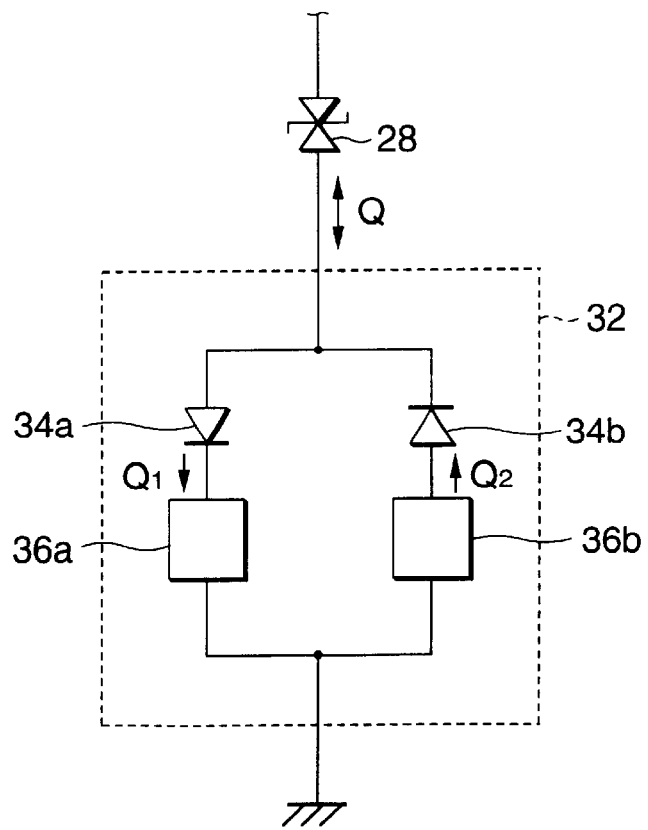
FIG. 3 is a circuit diagram to show one example of a charge amount measuring instrument.

Each charge amount measuring instrument 32 has a charge amount measuring device 36a and a diode 34a for measuring positive charge amount Q1 and a charge amount measuring device 36b and a diode 34b for measuring negative charge amount Q2; the charge amount measuring device 36a and the diode 34a are connected in parallel with the charge amount measuring device 36b and the diode 34b, as in an example shown in FIG. 3. Each charge amount measuring device 36a (each charge amount measuring device 36b) consists of an ampere meter and an integrator, for example.

The charge amount Q flowing through each bidirectional constant-voltage element 28 may be switched and measured with one charge amount measuring instrument rather than a plurality of charge amount measuring instruments 32. The same holds true with regard to each charge amount measuring device 36a and 36b in FIG. 3.

The charge amount measuring instrument 32 is provided, whereby charge-up of the substrate 2 can be measured simulatedly and moreover with high accuracy based on the passing-through charge amount rather than the electric current.

Figure 8:
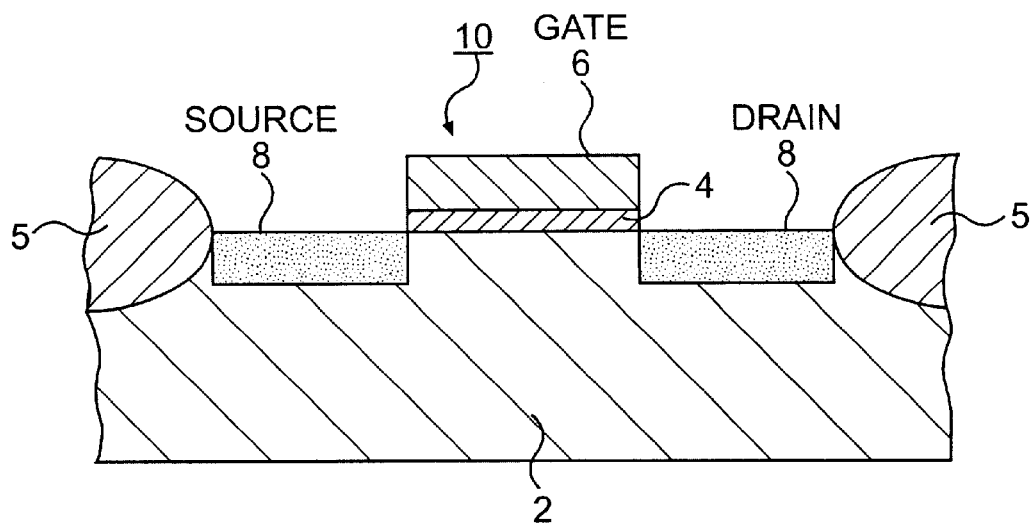
FIG. 8 is a schematic sectional view to show one example of a MOS field effect transistor formed on the surface of a semiconductor substrate on an enlarged scale.

To use the charge-up measuring apparatus 20 with an ion implantation apparatus f or forming MOS field effect transistors 10, for example, as shown in FIG. 8 on the surface of the substrate 2 as a semiconductor substrate by ion implantation, preferably the breakdown voltage of each bidirectional constant-voltage element 28 is made almost equal to the withstand voltage of the gate oxide film 4 of the MOS field effect transistor 10. Thus, the maximum charge-up voltage of each measurement conductor 22 can be made almost equal to the maximum charge-up voltage of the MOS field effect transistor 10 on the substrate surface, so that charge-up can be measured simulatedly and moreover with higher accuracy. As described above, the charge-up voltage of the MOS field effect transistor 10 does not rise above the withstand voltage of the gate oxide film 4 of the MOS field effect transistor 10; the charge-up voltage of each measurement conductor 22 does not rise above the breakdown voltage either as the bidirectional constant-voltage element 28 conducts, so that the charge-up state of the substrate 2 can be simulated more accurately.

To use the charge-up measuring apparatus 20 with the ion implantation apparatus for forming MOS field effect transistors 10 on the surface of a semiconductor substrate, the breakdown voltage of each bidirectional constant-voltage element 28 is set as described above and the charge amount measuring instrument 32 may be used rather than the current measuring instrument 30, whereby the amount of charges penetrating the gate oxide film 4 of the MOS field effect transistor 10 because of charge-up can be measured simulatedly with higher accuracy. Consequently, not only measurement of the charge-up state of the MOS field effect transistor 10 on the substrate surface, but also the following measurement is enabled:

The gate oxide film 4 of the MOS field effect transistor 10 usually has a self-recovery capability, but if the amount of all charges penetrating the gate oxide film 4 becomes a predetermined value (for example, 10 coulomb/cm$^2$) or more, the self-recovery capability is lost and the gate oxide film 4 is electrically broken down. That is, the MOS field effect transistor 10 is electrically broken down. Since the charge-up measuring apparatus 20 can measure the amount of the charges penetrating the gate oxide film 4 simulatedly with higher accuracy, it is also made possible to simulatedly measure a break mode based on the amount of charges passing through the gate oxide film 4 and by extension through the MOS field effect transistor 10. That is, it is also made possible to simulatedly measure the amount of charges flowing because of charge-up with respect to the passing-through charge amount at which the MOS field effect transistor 10 is not self-recovered.

Figure 4:
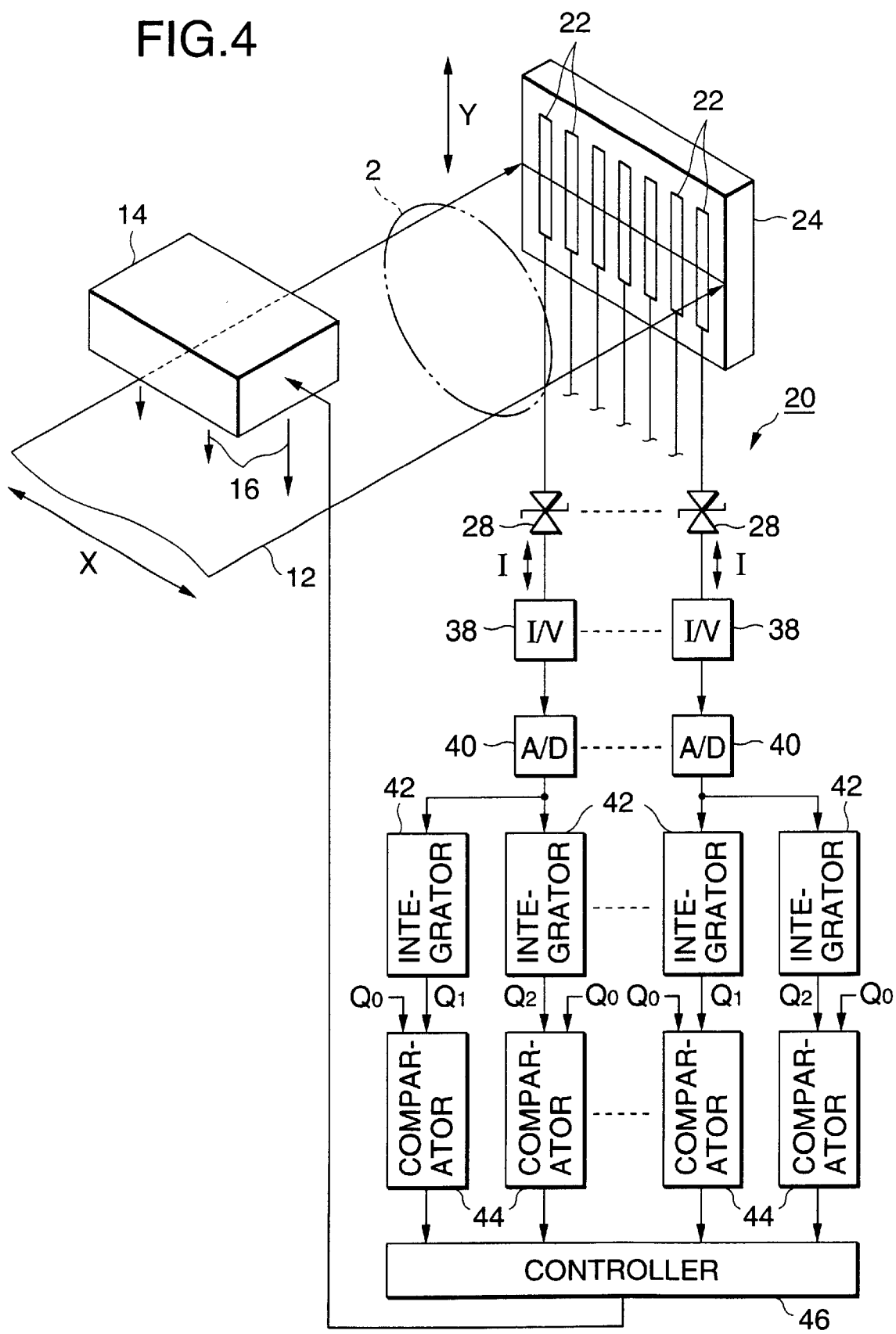
FIG. 4 is a drawing to show another example of a charge-up measuring apparatus according to the invention used with an ion beam irradiation apparatus.

FIG. 4 is a drawing to show another embodiment of a charge-up measuring apparatus according to the present invention used with an ion beam irradiation apparatus. The differences between this charge-up measuring apparatus and the charge-up measuring apparatus previously described with reference to FIG. 1 will be mainly discussed. In the embodiment in FIG. 4, electric current I flowing through any of directional constant-voltage elements 28 is converted into voltage by a current-voltage converter 38 corresponding to the directional constant-voltage element 28, the provided voltage is converted into a digital signal by an A/D converter 40 corresponding to the current-voltage converter 38, the positive side and the negative side are integrated and positive charge amount Q1 and negative charge amount Q2 are calculated by two integrators 42 corresponding to the A/D converter 40, the positive charge amount Q1 and the negative charge amount Q2 are compared with a reference charge amount Q0 by two comparators 44 corresponding to the two integrators 42, and the results are fed into a plasma supply source controller 46, which then controls a plasma supply source 14.

For example, for an ion implantation apparatus for forming MOS field effect transistors 10 as described above on the surface of a substrate 2, the non-recovery charge amount of a gate oxide film 4 is about 10 coulomb/cm$^2$ as described above. Thus, the value multiplied by a safety factor smaller than one (for example, about 0.1 to 0.01) maybe selected as the reference charge amount Q0.

For example, when the number of input points, namely, measurement conductors 22 with the positive charge amount Q1 exceeding the reference charge amount Q0 is a predetermined number or more, the amount of plasma 16 emitted from the plasma supply source 14 is increased under the control of the plasma supply source controller 46. On the other hand, when the number of input points, namely, measurement conductors 22 with the negative charge amount Q2 exceeding the reference charge amount Q0 is a predetermined number or more, the amount of plasma 16 emitted from the plasma supply source 14 is decreased under the control of the plasma supply source controller 46, whereby the amount of the plasma 16 emitted from the plasma supply source 14 and by extension the amount of electrons can be optimized for suppressing charge-up. Thus, a good result, for example, as shown in FIG. 7 can be provided.

In the example in FIG. 4, each current-voltage converter 38 and each A/D converter 40 correspond to each current measuring instrument 30 shown in FIG. 1, and each current-voltage converter 38, each A/D converter 40, and integrators 42 correspond to each charge amount measuring instrument 32 shown in FIG. 1.

According to the first aspect of the present invention, if any of the measurement conductors has charge-up voltage raised to the breakdown voltage of the bidirectional constant-voltage element, the bidirectional constant-voltage element connected to the measurement conductor is brought into conduction and the electric current of the polarity and the magnitude responsive to the charge-up of the measurement conductor flows through the bidirectional constant-voltage elements into the current measuring instrument corrected thereto, and can be measured with the current measuring instrument, so that charge-up of the substrate can be measured simulatedly.

Moreover, the charge-up voltage of each measurement conductor does not rise above the breakdown voltage of the corresponding bidirectional constant-voltage element as the bidirectional constant-voltage element conducts, so that at the measuring time, the effect of the voltage of each measurement conductor on the orbit of low energy electros can be lessened. Therefore, charge-up of the substrate can be measured simulatedly and moreover with high accuracy.

According to the second apsect of the present invention, a plurality of charge amount measuring instruments each for measuring the amounts of positive and negative charges flowing through the corresponding bidirectional constant-voltage element are provided. Thus, charge-up of the substrate can be measured simulatedly and moreover with high accuracy based on the passing-through charge amount.

According to the third aspect of the present invention, the breakdown voltage of each bidirectional constant-voltage element is made almost equal to the withstand voltage of the gate oxide film of the MOS field effect transistor formed on the surface of the semiconductor substrate. Thus, the maximum charge-up voltage of each measurement conductor can be made almost equal to the maximum charge-up voltage of the MOS field effect transistor on the substrate surface. Therefore, charge-up of the MOS field effect transistor on the substrate surface can be measured simulatedly and moreover with higher accuracy.

According to the fourth aspect of the present invention, a plurality of charge amount measuring instruments each for measuring the amounts of positive and negative charges flowing through the corresponding bidirectional constant-voltage element are provided. Thus, the amount of charges penetrating the gate oxide film of the MOS field effect transistor because of charge-up can be measured simulatedly with higher accuracy, whereby not only measurement of the charge-up state of the MOS field effect transistor 10, but also simulated measurement of the break mode based on the amount of charges passing through the gate oxide film can be made.

What is claimed is:

1. A charge-up measuring apparatus for use with an ion beam irradiation apparatus for irradiating a substrate with an ion beam, said charge-up measuring apparatus comprising:

a plurality of measurement conductors for measuring the charge-up state on the substrate, the plurality of measurement conductors being coplanarly arranged, wherein a plane in which the plurality of measurement conductors are coplanarly arranged is substantially perpendicular with the direction of the ion beam, and wherein the plurality of measurement conductors and the substrate are physically separated;

a plurality of bidirectional constant-voltage elements being connected to said plurality of measurement conductors in a one-to-one correspondence; and a plurality of current measuring instruments each for measuring the polarity and magnitude of an electric current flowing through the corresponding bidirectional constant-voltage element.

2. A charge-up measuring apparatus according to claim 1, wherein the plurality of bi-directional constant-voltage elements comprise bidirectional Zener diodes.

3. A charge-up measuring apparatus for use with an ion beam irradiation apparatus for irradiating a substrate with an ion beam, said charge-up measuring apparatus comprising:

a plurality of measurement conductors for measuring the charge-up state on the substrate, the plurality of measurement conductors being coplanarly arranged, wherein a plane in which the plurality of measurement conductors are coplanarly arranged is substantially perpendicular with the direction of the ion beam, and wherein the plurality of measurement conductors and the substrate are physically separated;

a plurality of bidirectional constant-voltage elements being connected to said plurality of measurement conductors in a one-to-one correspondence; and a plurality of charge amount measuring instruments each for measuring the amounts of positive and negative charges flowing through the corresponding bidirectional constant-voltage element.

4. A charge-up measuring apparatus according to claim 3, wherein the plurality of bi-directional constant-voltage elements comprise bidirectional Zener diodes.

5. A charge-up measuring apparatus for use with an ion implantation apparatus for irradiating a semiconductor substrate with an ion beam for forming a MOS field effect transistor on a surface of the semiconductor substrate, said charge-up measuring apparatus comprising:

a plurality of measurement conductors for measuring the charge-up state on the substrate, the plurality of measurement conductors being coplanarly arranged, wherein a plane in which the plurality of measurement conductors are coplanarly arranged is substantially perpendicular with the direction of the ion beam, and wherein the plurality of measurement conductors and the substrate are physically separated;

a plurality of bidirectional constant-voltage elements being connected to said plurality of measurement conductors in a one-to-one correspondence, each of said plurality of bidirectional constant-voltage elements having a breakdown voltage almost equal to withstand voltage of a gate oxide film of the MOS field effect transistor; and a plurality of current measuring instruments each for measuring the polarity and magnitude of an electric current flowing through the corresponding bidirectional constant-voltage element.

6. A charge-up measuring apparatus according to claim 5, wherein the plurality of bi-directional constant-voltage elements comprise bidirectional Zener diodes.

7. A charge-up measuring apparatus for use with an ion implantation apparatus for irradiating a semiconductor substrate with an ion beam for forming a MOS field effect transistor on a surface of the semiconductor substrate, said charge-up measuring apparatus comprising:

a plurality of measurement conductors for measuring the charge-up state on the substrate, the plurality of measurement conductors being coplanarly arranged, wherein a plane in which the plurality of measurement conductors are coplanarly arranged is substantially perpendicular with the direction of the ion beam, and wherein the plurality of measurement conductors and the substrate are physically separated;

a plurality of bidirectional constant-voltage elements being connected to said plurality of measurement conductors in a one-to-one correspondence, each of said plurality of bidirectional constant-voltage elements having a breakdown voltage almost equal to withstand voltage of a gate oxide film of the MOS field effect transistor; and a plurality of charge amount measuring instruments each for measuring the amounts of positive and negative charges flowing through the corresponding bidirectional constant-voltage element.

8. A charge-up measuring apparatus according to claim 7, wherein the plurality of bidirectional constant-voltage elements comprise bidirectional Zener diodes.

* * * * *